United States Patent [19]
Rosen et al.

[11] Patent Number: 5,936,513
[45] Date of Patent: Aug. 10, 1999

[54] NICKEL-IRON-MANGANESE OXIDE SINGLE CRYSTALS

[75] Inventors: Carol Zwick Rosen, Teaneck, N.J.; Donald G. Wickham, Malibu, Calif.

[73] Assignee: Thermometrics, Inc., Edison, N.J.

[21] Appl. No.: 08/919,372

[22] Filed: Aug. 22, 1997

Related U.S. Application Data

[60] Provisional application No. 60/025,210, Aug. 23, 1996.

[51] Int. Cl.$^6$ .............................. H01C 7/00; C01G 45/00; C01G 49/00; G01K 7/00
[52] U.S. Cl. ...................... 338/225 D; 338/28; 423/594; 374/185; 117/946
[58] Field of Search ...................................... 423/594, 599; 117/946, 41, 78; 23/305 R, 305 F; 374/185; 338/22 R, 22 SD, 25, 28

[56] References Cited

U.S. PATENT DOCUMENTS

| | | |
|---|---|---|
| 3,343,151 | 9/1967 | Brown et al. . |
| 3,510,820 | 5/1970 | Jonker et al. . |
| 3,568,125 | 3/1971 | Villemant et al. . |
| 3,612,535 | 10/1971 | Davis et al. . |
| 3,846,776 | 11/1974 | Kahn . |
| 4,324,702 | 4/1982 | Matsuo et al. . |
| 4,347,166 | 8/1982 | Tosaki et al. . |
| 4,519,870 | 5/1985 | Matsuzawa et al. ..................... 156/603 |
| 4,729,852 | 3/1988 | Hata . |
| 4,840,925 | 6/1989 | Rousset et al. . |
| 4,891,158 | 1/1990 | Hata . |
| 5,246,628 | 9/1993 | Jung et al. . |
| 5,653,954 | 8/1997 | Rosen et al. . |

FOREIGN PATENT DOCUMENTS

| | | |
|---|---|---|
| 2-143502 | 6/1990 | Japan . |
| 3-136206 | 6/1991 | Japan . |
| 3-214702 | 9/1991 | Japan . |
| 3-214703 | 9/1991 | Japan . |

OTHER PUBLICATIONS

E.G. Larson, R.J. Arnott, D.G. Wickham, "Preparation, Semi–conduction and Low Temperature Magnetization of the System $Ni_{1-x}Mn_{2+x}O_4$," *J. Physics and Chenistry Solids*, vol. 23, (1962), pp. 1771–1781, no month.

K.J.Standley, *Oxide Magnetic Materials, Monographs on the Physics and Chemistry of Materials*. 2nd ed., Clarendon Press. Oxford (1972), p. 140, no month.

D.G. Wickham, "Solid–Phase Equilibria In the System $NiO-Mn_2O_3-O_2$," *J. Inorg. Nucl. Chem.*, 26(1964), pp. 1369–1377, no month.

D.G. Wickham, "The Chemical Compositions of Spinels in the System $Fe_3O_4-Mn_3O_4$," *J. Inorg. Nucl. Chem.*, 31, 313 (1969), no month.

A.E. Paladino, Jr., "Phase Equilibria in Ferrite Region of the System Fe–Ni–O," *J. Am. Ceram. Soc.*, 42[4] 168–75 (1959), no month.

Topfer, et al., "Structure, properties and cation distribution of spinels of the series FeNiMn2O4 . . . " J. of Alloys and Compounds, 215, pp. 97–103, 1994.

Leonid V. Azároff, "Formation, structure, and bonding of Ni–Co–Mn oxides having spinel–type strukture," *Zeitschrift für Kristallographice*, Bd. 112, S. 33–43 (1959).

H. Makram, "Growth of Nickel Manganite Single Crystals," *Journal of Crystal Growth 1*, 1967, North–Holland Publishing Co., Amsterdam, pp. 325–326.

J. Ross Macdonald, *"Impedance Spectroscopy—Emphasizing Solid Materials and Systems,"* pp. 1–26, no date.

Takashi Yokoyama et al., "Formation of Mono Phase Cubic Spinel Consisting of Mn, Co and Ni Oxide and its Electrical Properties," *Journal of the Materials Science Society of Japan*, vol. 28, No. 5, 1991, pp. 271–275.

Takashi Yokoyama et al., "Influence of Firing Atmosphere on Crystal Structures of Mn–Co–Ni Oxide for Thermistor Material," *Journal of the Ceramic Society of Japan, International Edition*, vol. 97, No. 4, Apr. 1989, pp. 417–422.

G. Villers & R. Buhl, "Preparation, etudes cristallines et magnetiques du manganite de nickel $NiMn_2O_2$," *C.R. Acad. Sc. Paris*, t. 260, 1965, Groupe 8, pp. 3406–3409.

T. Sasamoto et al., "Crystal Structure and Electrical Property of Mn–Fe–Co–Ni Oxide For Thermistor Materials in the Manufacture Process," *Key Engineering Materials*, Trans Tech Publications, Switzerland, 1991, vols. 53–55, pp. 101–106.

T. Yokoyama et al., "Preparation and electrical properties of monophase cubic spinel, $Mn_{1.5}Co_{0.95}Ni_{0.55}O_4$, derived from rock salt type oxide," *Journal of Materials Science*, Chapman and Hall (1995), vol. 30, pp. 1845–1848.

V.A.M. Brabers and J.C.J.M. Terhell, "Electrical Conductivity and Cation Valencies in Nickel Manganite," Department of Physics, University of Technology, Eindhonen, The Netherlands, 1982, pp. 325–332.

*Primary Examiner*—Steven Bos
*Attorney, Agent, or Firm*—Lerner, David, Littenberg, Krumholz & Mentlik, LLP

[57] ABSTRACT

The invention relates to the growth of nickel-iron-manganese oxide monocrystals having a cubic spinel geometry. Methods of their growth and sensors constructed with same are also described.

21 Claims, 7 Drawing Sheets

NICKEL-IRON-MANGANESE OXIDE SINGLE CRYSTALS

The present application claims benefit of U.S. Provisional application Ser. No. 60/025,210, which was filed on Aug. 23, 1996.

FIELD OF THE INVENTION

The invention relates to the field of growing monocrystals, particularly of nickel-iron-manganese-oxide with cubic spinel structure, methods of their production and their use.

BACKGROUND OF THE INVENTION

Monocrystalline materials may offer a high degree of uniformity in terms of their physical properties as well as a high degree of repeatability and efficiency when compared to polycrystalline ceramic materials (polycrystals) of the same material. Therefore, monocrystals or single crystals which do in fact exhibit such properties are highly prized as replacements for polycrystalline materials wherever such materials are used. Moreover, because of their highly desirable properties, monocrystalline materials are sought out for applications for which polycrystalline material would never be considered. For example, in optical applications, polycrystals will provide a diffuse reflection of incident light whereas monocrystals would yield specular reflection.

In accordance with the present invention, and indeed generally, monocrystals can be differentiated from polycrystals based on a number of factors. Monocrystals are sized and shaped such that they can be used individually in the production of sensors, probes and the like. Polycrystalline materials are those made up of a composite of many individual crystals. Many ceramic materials are polycrystalline in nature as are many rocks and fabricated metals. The size of crystallites in polycrystalline material are usually small with equivalent diameters in many materials varying from a few micrometers to about 100 micrometers. Much larger crystallites are possible. However, because of physical properties such as, for example, packing density and other issues common in the ceramics field, it is usually advantageous to insure that the individual crystals do not get too large and are of as uniform a size and composition as possible. In the context of the present invention, however, when referring to a single crystal, preferably, an isolated crystal which is large enough to individually manipulate is envisioned. Preferably, individual crystals are desirably at least about a millimeter in size or greater, along one edge. Crystals of a centimeter on a single edge are desirable for many applications. In addition, significant improvements in precision (repeatability) and accuracy (true value) are achieved when monocrystals are diced into specimens or slices of the order of, or less than, a few tenths of a millimeter size along an edge.

There are other significant differences as well, most of which stem directly from the fact that monocrystals are, as their name implies, singular, whereas polycrystals involve the interaction of at least two crystals and suffer from charge carrier scattering at their grain boundaries, where modifications to the electric conductivity likely takes place. In fact, transport processes such as electric and thermal conductivities and dielectric properties of the crystal differ considerably from those of ceramic samples.

Polycrystalline ceramic materials (polycrystals) can be thought of as a composite material made up of two or more distinct individual crystals but usually a large number of crystals. Just as the polycrystalline materials are composites of the individual crystals, so too are their properties. Polycrystals have voids and often two or more stoichiometries and phases. These features each have an effect on the overall properties of the material and any device or sensor made using them. For example, the dielectric tensor of semiconducting polycrystalline materials is less than that of the corresponding semiconducting monocrystal of that same material because of the presence of voids. The resistivity (inverse electric conductivity) and the thermal conductivity of the polycrystalline material is also affected thereby. Monocrystals, which do not suffer from such composite properties will not exhibit such a strong dispersion in their impedance-frequency characteristics. See E. G. Larson, R. J. Arnott, D. G. Wickham, "Preparation, Semiconduction and Low Temperature Magnetization of the System $Ni_{1-x}Mn_{2+x}O_4$", J. Physics and Chemistry Solids, Vol.23, (1962), 1771–1781.[1] See also Oxide Magnetic Materials, K. J. Standley, Monographs on the Physics and Chemistry of Materials. 2 ed. Clarendon Press. Oxford (1972), pp. 140–141.[2]

Moreover, since no two groups of polycrystals can be exactly the same, i.e., same number of crystals of identical size, orientation, stoichiometry and composite properties, even within the same lot, the response of one sensor made with one group of polycrystals may vary with respect to other such sensors. Polycrystals may also be problematic because they may absorb water, particularly in the voids between crystals. When such material is exposed to variations in humidity, "aging" or a lack of reproducibility of properties over time and/or temperature may be accelerated and greater in comparison to comparable monocrystals. Moreover, the size of the voids between individual crystals may change with time and exposure to the elements and in response to external electric fields. Again, the thermal and electrical properties of the resulting material may therefore change over time. Monocrystals do not suffer from these same aging limitations.

Finally, with regard to certain materials and in particular cubic spinel crystals, there may be magnetic ordering effects over temperature in monocrystals. But with polycrystals, exposure to a magnetic field may cause movement of the individual crystals. This would result in a change in the grain boundaries and the size and shape of any voids and lead to hysteretic effects. The composite properties of the material would change accordingly. Certainly, the magnetic, thermal and electric properties of monocrystals can be more accurately measured and more repeatedly relied upon than polycrystalline materials.

Cubic spinel crystals, such as the crystals of the present invention, provide isotropic properties. For example, transport processes, such as electric conductivity, are isotropic.

Polycrystals of nickel manganese oxide are known, see D. G. Wickham, "Solid-Phase Equilibria In The System NiO—$Mn_2O_3$—$O_2$," J. Inorg. Nucl. Chem., 26, (1964), 1369–1377 [3], as are monocrystals of this system. See Rosen et al., U.S. Pat. No. 5,653,954, the text of which is hereby incorporated by reference and attached. Polycrystals of nickel-cobalt-manganese are also known to exist. For example, polycrystalline materials of nickel-cobalt-manganese oxides were reported by L. V. Azaroff, see Z. Kristallogr., volume 112, pages 33–43, (1959). However, monocrystals of nickel-cobalt-manganese were unknown until their invention by the present inventors. See Rosen et al., U.S. patent application Ser. No. 08/877,415, filed Jun. 17, 1997 and titled Growth of Nickel-Cobalt-Manganese Oxide Single Crystals, the text of which is hereby incorporated by reference.

Despite the success the inventors achieved throughout the growth of nickel-manganese oxide and manganese-cobalt-nickel oxide monocrystals, there was no way to predict how the introduction of an additional variable to the system (namely iron) would affect the ability to produce monocrystals or their comparative properties to the corresponding polycrystals. There is simply no way to predict what the result would be. This is particularly true in this case because of the peculiar chemistry of iron with respect to its oxidation states.

SUMMARY OF THE INVENTION

The present invention provides monocrystalline nickel-iron-manganese oxide having a cubic spinel structure. In particular, the present invention provides such crystals over a full cubic spinel range of manganese/iron/nickel ratios and lattice parameters. These compositions can be represented by the region of solid solutions within and, where appropriate, including the sides of the polygon shown in FIG. 1 (i.e., polygon A B B' D F A).

Monocrystals are contemplated having a cubic spinel structure and an atomic ratio R [R=Mn/(Mn+Ni+Fe)] which ranges from between about 0.252 to about 0.800 based on the amount of manganese. Comparable numbers based on nickel and/or iron are also contemplated. These nickel-iron-manganese oxide monocrystals of the present invention have a cubic spinel structure and a lattice parameter which ranges from between about 8.338 and about 8.519 Angstroms. Preferably, the lattice parameter will range from between about 8.338 and about 8.436 Angstroms. Most preferably, the lattice parameter will range from between about 8.343 and about 8.424 Angstroms.

In other aspects of the present invention, there are also provided a number of methods of producing nickel-iron-manganese oxide monocrystals along the entire possible range of manganese to nickel to iron ratios, such that the resulting crystals have a cubic spinel structure.

The present invention also provides various methods of producing cubic spinel monocrystals of nickel-iron-manganese oxide from known or determined amounts of starting materials. It is also possible to predict a number of the physical properties of the resulting monocrystal (such as resistivity-temperature and temperature-chemical stability and resistivity-chemical stability characteristics) based on the proportion of $Mn_2O_3$, $Fe_2O_3$ and NiO in the initial melt.

Finally, in accordance with the present invention unique and advantageous sensors using at least a portion of a nickel-iron-manganese oxide monocrystal having a cubic spinel structure as described herein are provided. Various devices which use such sensors and methods of their use are also contemplated.

It has been unexpectedly found that by use of the methods of the present invention, one can in fact produce, with a high degree of accuracy and precision, monocrystals of nickel-iron-manganese oxide having a cubic spinel structure and very advantageous and useful electrical properties. The resulting monocrystals do not suffer from many of the limitations and disadvantages of polycrystalline or ceramic materials, even those made from the same elements. Moreover, by the practice of the present invention, one is able to produce crystals over a broad range of manganese to nickel to iron ratios.

The relationship between the starting materials useful for producing nickel-iron-manganese oxide monocrystals and the actual crystals that will result has been determined. Therefore, it is now possible to preselect a crystal based on one of its advantageous physical properties and/or the desired ratio of component elements and, with a high degree of accuracy, produce crystals having that physical property.

It is possible, in accordance with the present invention, to provide highly accurate temperature sensors or thermistors which provide significant advantages such as a high sensitivity, good reproducibility and better aging characteristics.

DETAILED DESCRIPTION OF THE PREFERRED EMBODIMENTS

One method of successfully growing the monocrystals of the present invention is the so-called "flux growth" method. In accordance with the flux growth method, nickel, iron and manganese oxides are charged, along with a $Bi_2O_3/B_2O_3$ flux into a platinum crucible. The bismuth and boron compounds are collectively referred to herein as the flux. The crucible and its contents are then placed into a furnace, preferably one having a carousel or other device to insure that each crucible receives the same thermal treatment and the mixture is heated to a specific melt temperature. The mixture is then held at that melt temperature, also referred to herein as the "top temperature" or "first elevated temperature," for a period of time sufficient to complete solution of the starting materials and, ideally, to eliminate the presence of particles which can act as seeds for uncontrolled crystal growth. This extended maintenance of the first elevated temperature is often termed "soaking," and soaking can last from between 6 to about 100 hours, or more if necessary. When soaking has been completed, the material is gradually cooled to a "second elevated temperature" also known as the "bottom temperature" or "quenching temperature", during which time crystal development and growth occurs. Within reason, the more gradual the cooling rate, the larger the resulting crystals. Finally, when the bottom temperature has been obtained, the contents of the crucible are removed from the oven and cooled to room temperature. Thereafter, the crystals are separated from the bismuth/boron oxide flux, cleaned and inspected.

Figure 6:
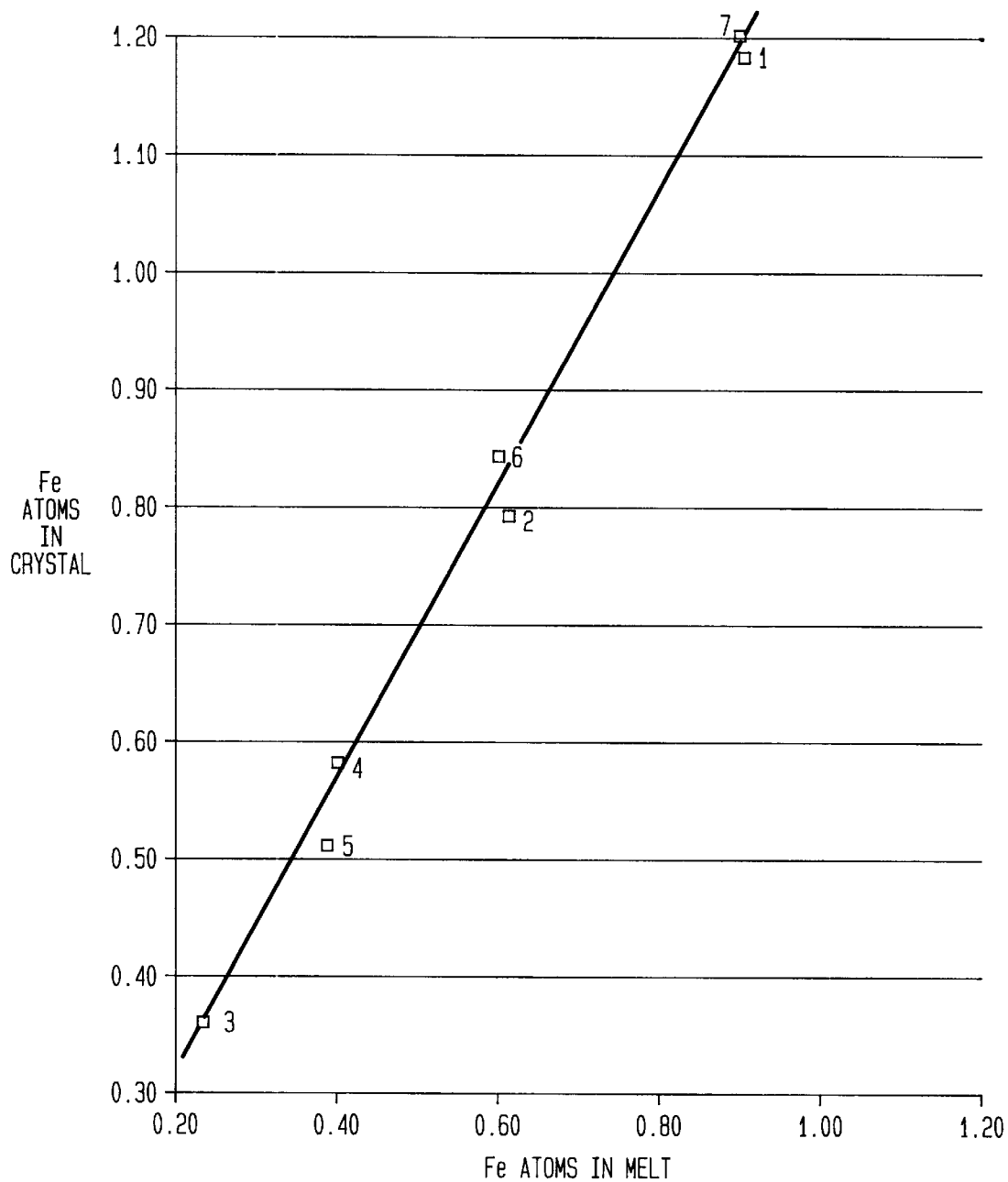
FIG. 6 shows a linear correlation between the number of iron atoms in the crystal and the number of iron atoms in the melt.

The amounts of nickel oxide, manganese oxide, and/or iron oxide, as well as the amounts of bismuth oxide and boron oxide useful in accordance with the present invention may vary depending upon a number of factors, including the size of the crystals wanted, the desired ratio of manganese to nickel to iron the size of the production run and the like. A relationship exists between the composition of the melt and the composition of the crystals. For example, FIG. 6 illustrates the relationship between the amount of iron atoms in the starting material or the original melt and that found in the resulting crystals. Similar illustrations can be provided based on Nickel and/or Manganese, not only over the ranges of materials used in Example I, but throughout the entire range of cubic spinel. See also FIG. 3 and Tables 6 and 7.

The amount of flux is not critical to the invention. The amount of flux must be sufficient to completely dissolve all the constituents and should be sufficient to allow for good homogenous mixing of all of the chemical species. Sufficient flux should also be provided so as to assure complete solution at the top temperatures used. To accomplish this, at least about 50 Mol % of flux should be provided. Similarly, the melt should not be too dilute.

$B_2O_3$ in the flux may range from between about 5 Mol % to about 50 Mol %, and more preferably from about 15 Mol % to about 25 Mol % of the flux. There is a eutectic at about 19–20 Mol % $B_2O_3$ of 622° C.[4]. This provides a good flux because it provides the lowest melting point and the greatest temperature range through which crystals may grow.

Melt temperature is an important consideration in accordance with the present invention. A preferred flux in accordance with the present invention has a eutectic temperature of about 622° C. The manganese oxide has a melting point of about 1705° C. in air. Nickel oxide has a melting point of almost 2000° C. and iron oxide has a melting point in the neighborhood of 1600° C. The boron/bismuth oxide flux acts upon the nickel, manganese and iron oxides to depress their melting points and create a homogenous solution.

The highest elevated temperature of the system also referred to herein as the "top temperature", "Tt" or "the first elevated temperature" must be high enough to dissolve all the components. However, the highest elevated temperature cannot be so high that, for example, too much of the relatively low melting point flux evaporates. At some lower temperature, where crystallization is complete, the material can be removed from the furnace. This is the bottom temperature also known as "quenching temperature", "second elevated temperature" or "$T_q$".

The melt used generally has a top temperature of 1350° C. A preferred melt temperature is about 1280° C. However, that temperature is by no means the upper limit for the first elevated temperature. In fact, any temperature which is suitable for a given flux and which causes the dissolution of all of the components while, at the same time, providing a relatively stable system may be utilized. Top temperatures in this system may be limited by the volatility of the $Bi_2O_3$ which varies with the composition of the melt. In accordance with the present invention, this first elevated temperature may range from between about 1200° C. to about 1400° C. and preferably from between about 1250° C. to about 1350° C. and more preferably from between about 1260° C. to about 1320° C.

Crystal growth occurs during the cooling from the first elevated temperature to the second elevated temperature. If the ratios of ingredients and the temperatures are correct, then, cubic spinel single crystals of nickel-iron-manganese oxide will result. In general, the longer that the material is allowed to cool to the quenching temperature, i.e., the more gradual the cooling, the larger the crystals. Melts have successfully been cooled at a rate of approximately 0.6° C. per hour from 1280° C. to 860° C. However, to promote the growth of even larger crystals, it may be desirable to decrease the cooling rate and/or extend the cooling time. Alternatively and/or in addition thereto, the quenching temperatures may be adjusted to provide a longer cooling period. In general, the cooling rate should range from between about 0.3 to about 5° C./hour and preferably between about 0.6 and about 1.0° C./hours.

Once the second elevated temperature is reached, the crystals are quenched. Quenching involves rapidly lowering the temperature so as to stop crystal formation in such a way that only the crystals of the desirable structure result. Quenching under a blanket of, for example, an anhydrous and inert gas is highly preferable. The process will yield crystals which may be freed from the bulk of the flux by any known means. One way to accomplish extraction is to use acids such as 10 Vol % nitric acid or 10–20 Vol %. acetic acid.

The crystals, when removed from the crucible and freed from the flux, are weighed and treated with the above described acid solutions, if necessary, to remove traces of the flux.

Monocrystals produced in accordance with the present invention are composed of nickel, manganese and iron oxides, have a cubic spinel structure and an atomic ratio R [R=Mn/(Mn+Ni+Fe)] which ranges from between about 0.252 to about 0.800 based on the amount of manganese. Comparable numbers based on nickel and/or iron are also contemplated. The nickel-iron-manganese oxide monocrystals of the present invention can also be described by reference to their composition and the so-called lattice parameter. The lattice parameter can range from 8.338 to 8.522 Angstroms. Generally, however, the lattice constant ranges from between about 8.338 and about 8.519 Angstroms. Preferably, the lattice parameter will range from between about 8.338 and about 8.436 Angstroms. Most preferably, the lattice parameter will range from between about 8.3427 and about 8.4239 Angstroms.

Figure 1:
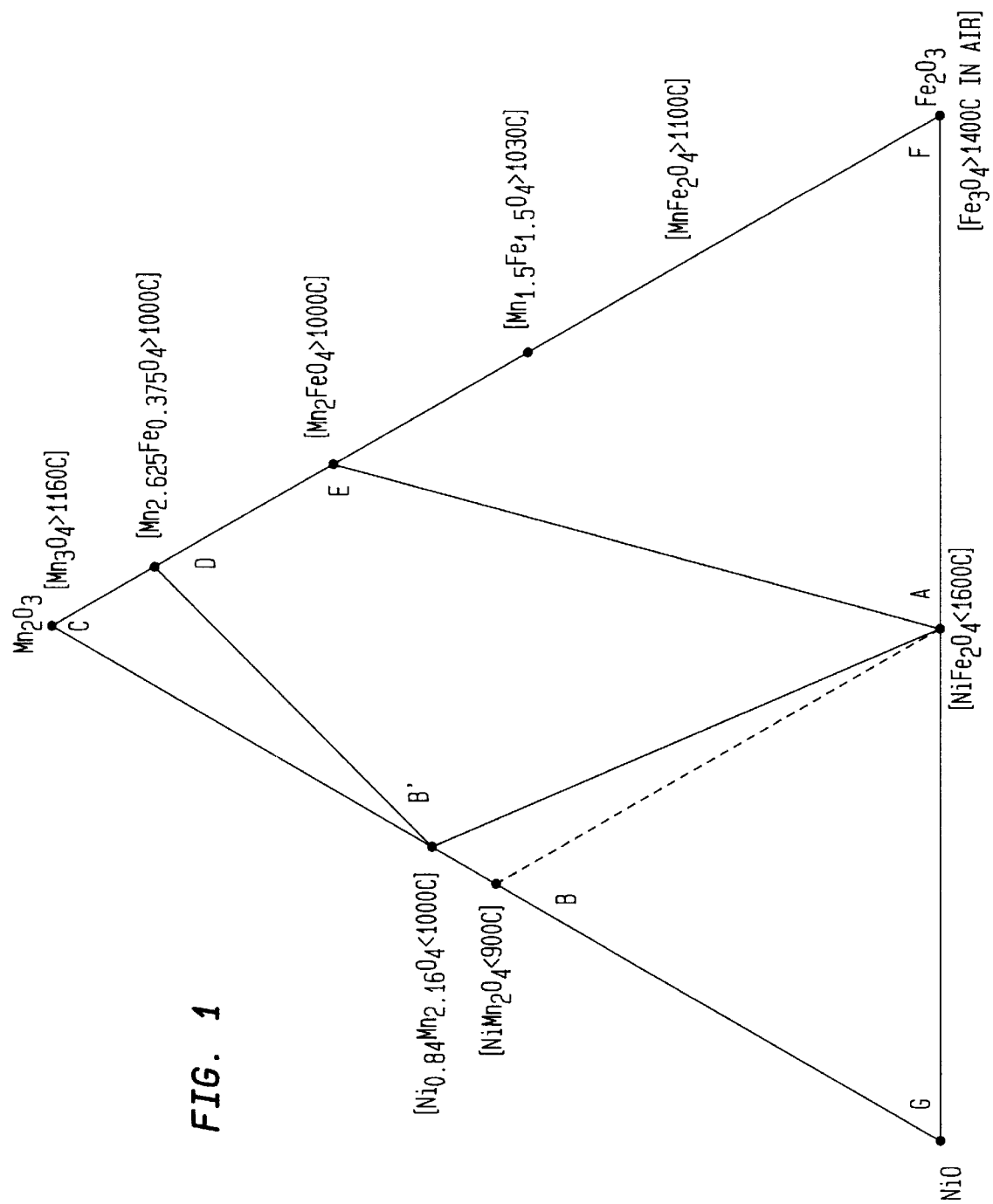
FIG. 1 is a pseudo-ternary diagram of composition and stability temperatures for the nickel-iron-manganese oxide system.
Figure 2:
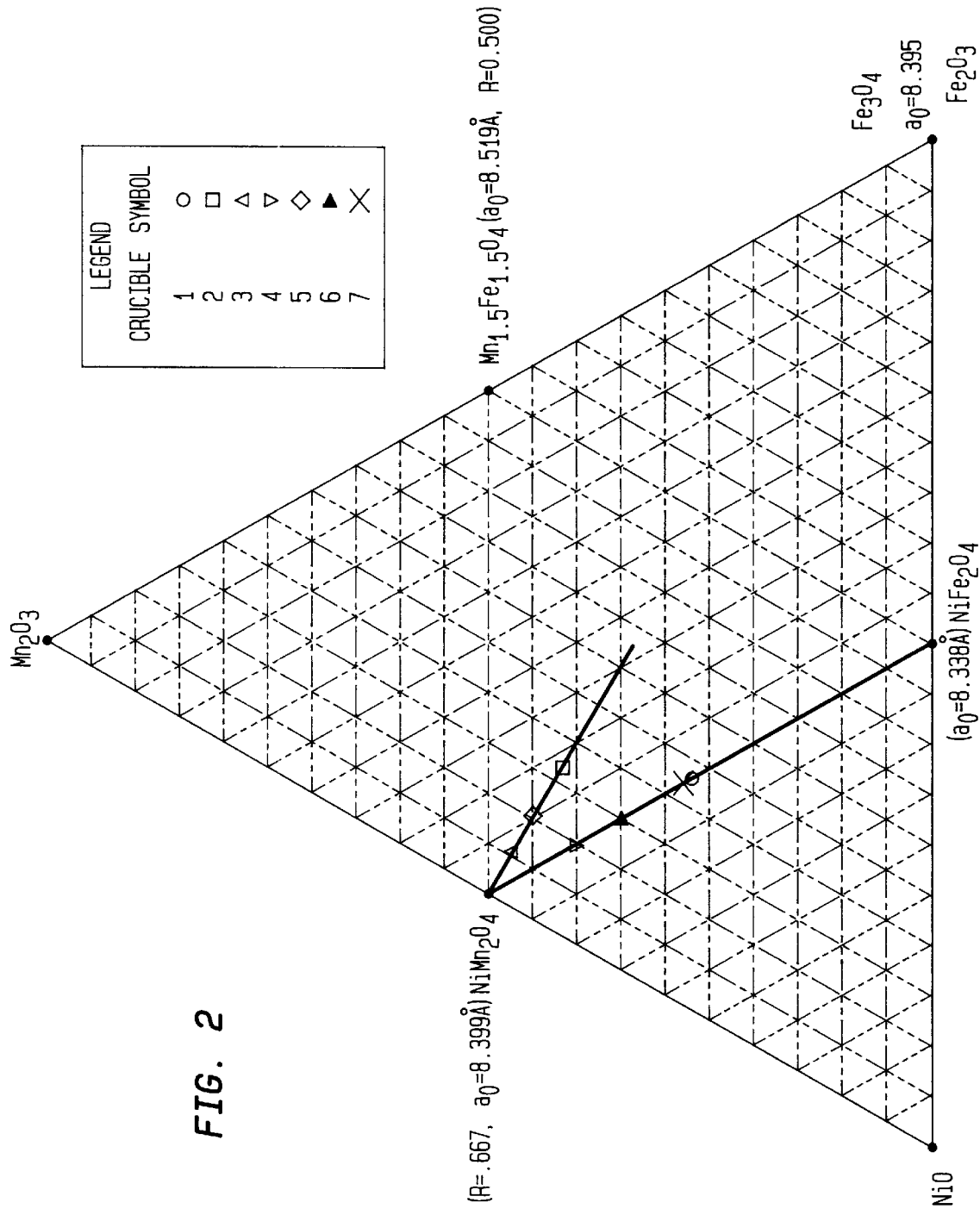
FIG. 2 is a ternary diagram of solute starting compositions.

An understanding of the interrelationship between the ratio of the starting materials in the initial melt and the ratio of nickel, iron and manganese in the resulting crystals has been discovered. Knowing same allows one to tailor make cubic spinel crystals of nickel-iron-manganese oxide of any desired nickel to iron to manganese ratios within the boundary compositions for a cubic spinel structure as illustrated in FIG. 1 (Generally the region bounded by a polygon connecting points A B B' D E A). This can be accomplished by varying the amounts of starting materials. Table 1 provides the relative amounts of starting materials necessary to obtain the points along the boundaries described above. Therefore, when designing ternary cubic spinel monocrystals in accordance with the present invention, it is important to select amounts which fall within these relative proportions. Any resulting cubic spinel monocrystal containing nickel, iron and manganese oxides bounded by the polygon in FIG. 1 is contemplated.

TABLE 1

| Pts. | NiO m/o | $F_2O_3$ m/o | $Mn_2O_3$ m/o |
| --- | --- | --- | --- |
| A | 50.00 | 50.00 | 0 |
| B | 50.00 | 0 | 50.00 |
| B' | 43.75 | 0 | 56.25 |
| C | 0 | 0 | 100.00 |
| D | 12.50 | 0 | 87.50 |

TABLE 1-continued

| Pts. | NiO m/o | F$_2$O$_3$ m/o | Mn$_2$O$_3$ m/o |
|---|---|---|---|
| E | 0 | 33.33 | 66.67 |
| F | 0 | 100.00 | 0 |

Some of the points along the lines forming the boundary of the polygon, such as point A, are not part of the invention as that point represents NiFe$_2$O$_4$ which occurs in the binary system (NiO—Fe$_2$O$_3$). The same is true for other points of the polygon; namely, NiFe$_2$O$_4$, NiMn$_2$O$_4$, and Mn$_{2.625}$Fe$_{0.375}$O$_4$. Fe$_3$O$_4$ is also excluded. Ternary compounds approaching these points are, however, within the scope of the invention Obviously, temperature also plays an important role in the formation of crystals, their structure, and their composition. FIG. 1 illustrates various compositions in the crystal system (NiO—Fe$_2$O$_3$—Mn$_2$O$_3$). The edges of the triangular diagram represent the binary systems (L), (M) AND (N) where:

(L) Fe$_2$O$_3$—Mn$_2$O$_3$;
(M) NiO—Mn$_2$O$_3$;
(N) NiO—Fe$_2$O$_3$.

These are therefore not part of the claimed invention. While the invention contemplates ternary compounds, it is often convenient to discuss and describe the binary boundaries and the conditions which affect them. Phase diagrams are available for L[5] M[3] and N[6]. All compositions within the area (A B B' C D E F A), i.e., to the right of the line connecting NiFe$_2$O$_4$ (Point A) and NiMn$_2$O$_4$ (Point B), can be prepared with the spinel crystal structure under a variety of temperatures and atmospheres. Spinels in the L system are stable in air only at high temperatures as indicated. They can be prepared at lower temperatures under oxygen pressures less than 0.21 atmospheres (air). The spinel Fe$_3$O$_4$ [Fe$^{2+}$(Fe$^{3+}$)$_2$O$_4$] and other compositions containing ferrous iron require strong reducing atmospheres which will require other flux systems.

Compositions roughly contained within area (A B G A) form two phases, a spinel and the rock-salt phase of NiO. Compositions in the area (A E F A), prepared in air, yield in addition to a spinel, an α-Fe$_2$O$_3$ phase with the hexagonal corundum structure, the more of it the closer the composition is to pure iron oxide. The spinel Fe$_3$O$_4$, exists in the air only above approximately 1400° C. NiFe$_2$O$_4$ is stable to a very high temperature; it is decomposed near the melting point at close to 1600° C. Therefore, ternary compositions near point A in FIG. 1 are of particular interest for their high temperature thermistor properties. The area in FIG. 1 (AB'DEA) contains the compositions expected to be stable in the air at 1000° C. Compositions in the triangle (BB'AB) which are in the system [NiMn$_2$O$_4$—Ni$_{0.84}$ Mn$_{2.16}$O$_4$—NiFe$_2$O$_4$] are stable up to temperatures which increase from 900° C. to 1600° C. These conditions should be considered when making ternary crystals in accordance with the present invention.

Figure 3:
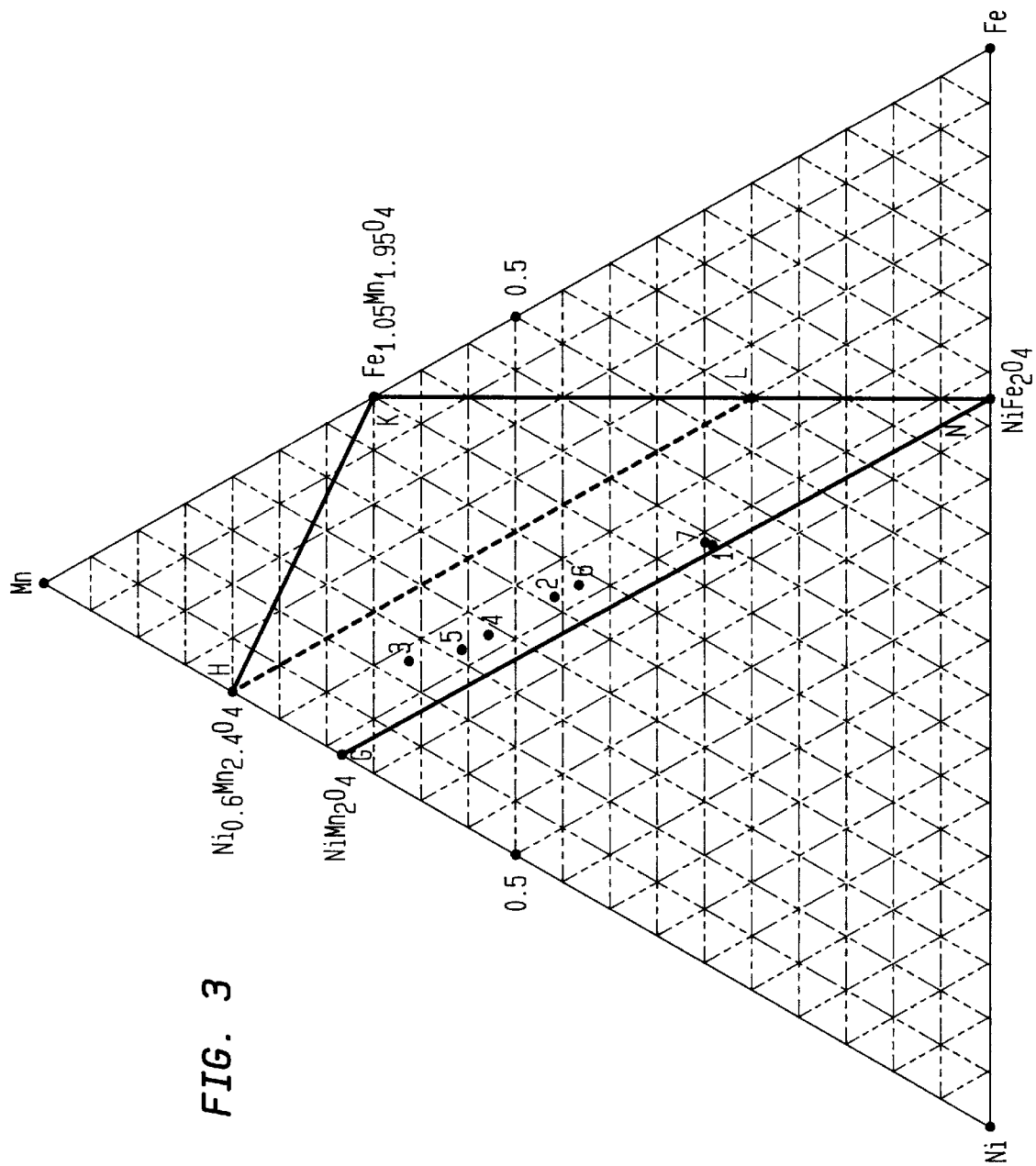
FIG. 3 is a composition diagram of cubic spinel crystals, Atomic Fraction ($M_3O_4$) showing the relative position of the crystals grown in crucibles 1 through 7, as discussed in Example I.

A more preferred embodiment is shown in FIG. 3 which shows an area in a ternary composition diagram for the cubic spinel system with formula M$_3$O$_4$. Nickel, iron and manganese atomic fractions are the coordinates. These fractions multiplied by three yield the coefficients in the formula M$_3$O$_4$. The area [GHKLNG] includes compositions which can be obtained at 25° C. with the cubic spinel structure. Crystals obtained by the methods described herein have compositions which lie within the area [GHLNG]. See Example 1. Crystals with compositions in the area [HKLH], can also be produced but with modifications in procedure such as in temperature limits, ambient oxygen pressure and constituents, NiO, Fe$_2$O$_3$ and Mn$_2$O$_3$ in the melt. Table 2 gives the coordinates for the boundary compositions (G, H, K, L, N) presented in FIG. 3 in Atomic Fraction.

TABLE 2

| Pts. | [Ni] | [Fe] | [Mn(R)] | a$_0$(Å) | NiO/M$_2$O$_3$ |
|---|---|---|---|---|---|
| G | 0.333 | 0 | 0.667 | 8.399 | 1.0 |
| H | 0.200 | 0 | 0.800 | 8.436 | 0.5 |
| K | 0 | 0.350 | 0.650 | 8.519 | 0 |
| L | 0.200 | 0.548 | 0.252 | — | 0.5 |
| N | 0.333 | 0.667 | 0 | 8.338 | 1.0 |

Figure 4:
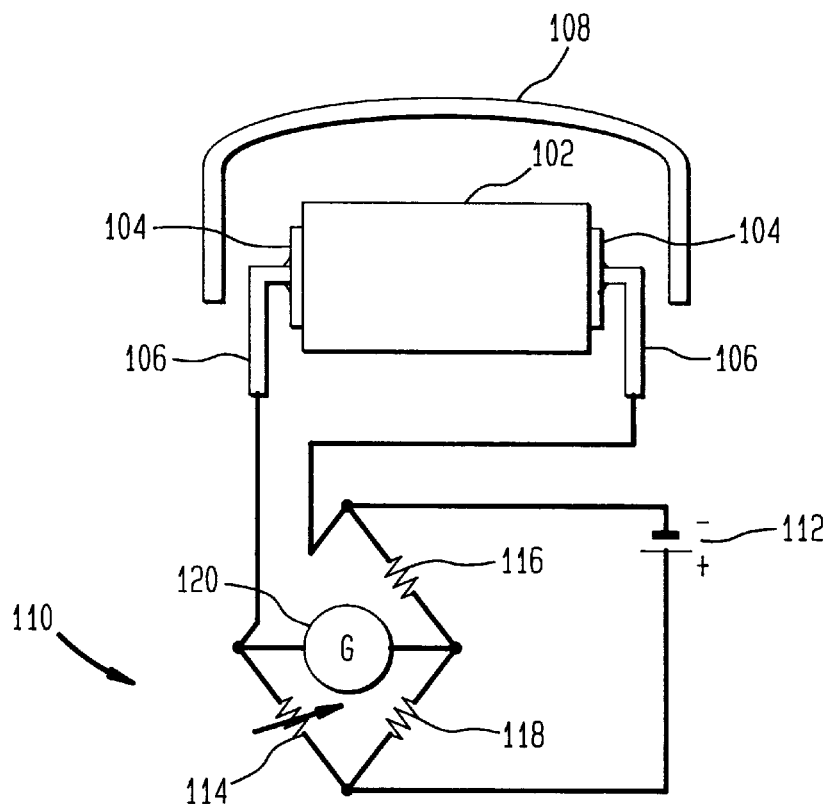
FIG. 4 is a diagrammatic view depicting a sensor in accordance with an embodiment of the invention.

Successfully producing ternary, cubic-spinel monocrystals within the boundary conditions for the Mn, Fe and Ni system is an achievement in and of itself. However, the electrical properties of the resulting material must still be checked to see if they actually offer advantages over the polycrystals. One way to check these properties and indeed, to use the crystals is to create a sensor from them. A sensor in accordance with the present invention is illustrated in FIG. 4. The sensor includes a sensing element 102 consisting of a monocrystalline nickel-iron-manganese oxide spinel made in accordance with the above-described embodiments of the invention, and a pair of electrical terminals 104 in substantially ohmic contact with the sensing element. Terminals 104 can be formed from noble metals and their alloys, copper, and aluminum and their alloys. Platinum, palladium and gold, and their alloys are particularly preferred. The metallic terminals can be applied by sputtering the metal of the terminal onto the spinel, or by electroplating, electroless plating, painting with a metallic paint or pressurized contact so that the metal of the terminal is in intimate contact with the spinel. Leads 106 are connected to the terminals by welding. Sensing element 102, contacts 104 and leads 106 are enclosed in a conventional housing 108, of which only a portion is illustrated in FIG. 4.

Figure 5:
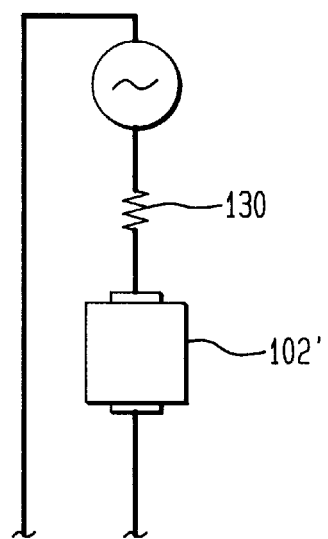
FIG. 5 is a diagrammatic view depicting an electrical circuit in accordance with the invention.

Leads 106, and hence the sensing element, are connected to an electrical resistance measuring device 110 adapted to measure the electrical resistance through the sensing element. The particular resistance-measuring device illustrated in FIGS. 4–5 is a Wheatstone bridge, incorporating a battery 112; a variable resistor 114 in series with the sensing element to form one branch; resistors 116 and 118 connected in series with one another to form another branch in parallel with the first branch and a galvanometer 120 connected between the branches. The circuit can be used to measure an unknown temperature by exposing the housing 108, and hence sensing element 102, to the unknown temperature, and adjusting resistor 114 until the bridge is in balance, whereupon galvanometer 120 shows no current flow. The resistance required to bring the bridge into balance is a measure of the resistance through the sensing element, and hence a measure of the unknown temperature. Many other conventional resistance-measuring instruments can be used in place of the Wheatstone bridge. For example, a conventional ohmmeter can be employed.

The sensing element can also be used to provide temperature compensation in an electrical circuit. For example, an electronic circuit may include resistor 130 connected in series with sensing element 102' similar to the sensing element discussed above, and further connected to other circuit components (not shown). When the circuit is exposed to changes in ambient temperature, the resistance of resistor 130 tends to increase with increasing temperature. The decrease in resistance of sensing element 102' compensates for such increase. The variation in impedance of the sensing element with temperature can be used to compensate for changes in properties of other electronic components, such as semiconductors, capacitors, inductors and the like. See generally the 1993 Thermometrics° Catalog, entitled "Worldwide Capability in Thermistors." The text of which is also incorporated by reference[7]. Sensing elements according to this aspect of the invention are particularly useful in circuits driven with alternating currents above about 10 Hz, and even more useful at higher frequencies. In contrast to polycrystalline sensors, the sensors according to this aspect of the invention have substantially lower dispersion or change in impedance with frequency than polycrystalline sensing elements.[1][2] Thermistors can operate between at least approximately −80 to 500° C.

The foregoing will be better understood with reference to the following examples. All references made to these examples are for the purposes of illustration. They are not to be considered limiting as to the scope and nature of the present invention.

EXAMPLE I

Monocrystals of nickel-iron-manganese oxide having a cubic spinel structure were grown in solutions of molten mixtures of bismuth and boron oxides (flux). Seven crucibles were individually charged with predetermined amounts of starting materials as indicated in Tables 3–5. Table 3 identifies the amounts of the metal oxide starting materials charged to each platinum crucible in mole percent relative to the solute only. Table 4 gives their formulations with a 70.00 mole percent (m/o) concentration of flux (solvent) having a ratio of $(B_2O_3:Bi_2O_3)=(19:81)$ m/o for compositions (1 to 6) and a ratio of $(B_2O_3:Bi_2O_3)=(20:80)$ m/o for composition (7). Table 5 identifies the actual weights of the components charged to each crucible.

TABLE 3

Starting Material as Initial Mole Percent (m/o)$_i$
Relative to the Solute
Initial Material

| $C_k$* | $(NiO)_i$ (m/o)$_i$ solute | $(Fe_2O_3)_i$ (m/o)$_i$ solute | $(Mn_2O_3)_i$ (m/o)$_i$ solute |
|---|---|---|---|
| 1 | 50.2 | 22.6 | 27.2 |
| 2 | 41.9 | 16.2 | 41.9 |
| 3 | 47.0 | 6.0 | 47.0 |
| 4 | 50.0 | 10.0 | 40.0 |
| 5 | 45.0 | 10.0 | 45.0 |
| 6 | 50.0 | 15.0 | 35.0 |
| 7 | 50.0 | 22.5 | 27.5 |

*$C_k$ is the symbol for crucible number k which ranges from k = 1 to 7.

TABLE 4

Starting Material as Initial Mole Percent (m/o)$_i$
Relative to the Solute Plus the Solvent
Initial (m/o)

| Crucible No. | $(Fe_2O_3)_i$ (m/o)$_i$ | $(NiO)_i$ (m/o)$_i$ | $(Mn_2O_3)_i$ (m/o)$_i$ | $(B_2O_3)_i$ (m/o)$_i$ | $(Bi_2O_3)_i$ (m/o)$_i$ | Flux = $(B_2O_3 + Bi_2O_3)_i$ (m/o)$_i$ | $(B_2O_3/Bi_2O_3)_i$* [(m/o)/(m/o)]$_i$ |
|---|---|---|---|---|---|---|---|
| 1 | 6.78 | 15.05 | 8.17 | 13.30 | 56.70 | 70.00 | 0.235 |
| 2 | 4.86 | 12.57 | 12.57 | 13.30 | 56.70 | 70.00 | 0.235 |
| 3 | 1.79 | 14.11 | 14.10 | 13.30 | 56.70 | 70.00 | 0.235 |
| 4 | 3.00 | 15.00 | 12.00 | 13.30 | 56.70 | 70.00 | 0.235 |
| 5 | 3.00 | 13.50 | 13.50 | 13.30 | 56.70 | 70.00 | 0.235 |
| 6 | 4.50 | 15.00 | 10.50 | 13.30 | 56.70 | 70.00 | 0.235 |
| 7 | 6.75 | 15.00 | 8.25 | 14.00 | 56.00 | 70.00 | 0.250 |

*Note Crucibles (1–6) all have initial mole percent ratios of $B_2O_3/Bi_2O_3$) equal to 0.235, or 19/81. The mole percent ratio for crucible 7 is $(B_2O_3/Bi_2O_3)_i$ equal to 0.250, or (20/80).

TABLE 5

Actual Weights of Starting Materials for 0.6 Moles*

| Material $C_k$ | $Fe_2O_3$ [gms] | NiO [gms] | $Mn_2O_3$ [gms] | $B_2O_3$ [gms] | $Bi_2O_3$ [gms] |
|---|---|---|---|---|---|
| 1 | 6.4960 | 6.7436 | 7.7430 | 5.5573 | 158.5194 |
| 2 | 4.6605 | 5.6333 | 11.9054 | 5.5581 | 158.5222 |
| 3 | 1.7124 | 6.3228 | 13.3605 | 5.5556 | 158.5200 |
| 4 | 2.8743 | 6.7233 | 11.3660 | 5.5569 | 158.5192 |
| 5 | 2.8744 | 6.0497 | 12.7885 | 5.5558 | 158.5238 |
| 6 | 4.3127 | 6.7224 | 9.9453 | 5.5555 | 158.5200 |
| 7 | 6.4679 | 6.7225 | 7.8147 | 5.8483 | 156.5639 |

*Note Atomic Weights (AW) and Formula Weights (FW)

| Element | (AW) | Formula | (FW) |
|---|---|---|---|
| B | 10.811 | $B_2O_3$ | 69.6202 |
| O | 15.9994 | $Bi_2O_3$ | 465.95894 |
| Mn | 54.93805 | $Mn_2O_3$ | 157.8743 |
| Fe | 55.847 | $Fe_2O_3$ | 159.6922 |
| Ni | 58.69 | NiO | 74.6894 |
| Bi | 208.98037 | | |

For each of the compositions 1 through 7, the following protocol was followed. Seven 50 ml platinum crucibles were provided. Into each, the appropriate amounts of NiO, $Fe_2O_3$, $Mn_2O_3$, $B_2O_3$ and $Bi_2O_3$, as indicated in Table 5 were weighed out and charged. An equilibrium between the material in the crucible and the oxygen in the atmosphere in the furnace is desirable, so the crucibles were not tightly covered. In fact, each platinum cover had a 0.3175 cm hole in its center. The crucibles were then placed into a furnace and heated to a top temperature of 1280° C. and soaked at that temperature for about 56 hours. The crucibles were then cooled to a temperature of 1250° C. over a period of 46 hours. The cooling rate was about 0.65 ° C./hr. The crucibles were next cooled to 1224° C. over a period of about 5 min. The rate of cooling was about 312.0° C./hr. The crucibles were then heated to return them to a temperature of 1250° C. This took place over a time of about 5 min. and at a rate of about 312.0° C./hr. The crucibles were maintained at 1250° C. for about one hour and then cooling resumed. The crucibles were cooled to 1150° C. over 3.58 days at a rate of about 1.16° C./hr. Next, the crucibles were cooled to 1124° C. over a period of about 1 day at a rate of 1.09° C./hr. The crucibles were next cooled to 900° C. over 9 days at a rate of 1.04° C./hr. Finally, the crucibles were cooled to 860° C. over the next two days at a rate of 0.83° C./hr.

After cooling to 860° C., the crucibles were brought to ambient temperatures by letting the assembly of covered crucibles cool slowly to room temperature. The monocrystals were recovered by treatment with 15 Vol. % acetic acid to dissolve the flux.

The resulting crystals were studied by x-ray diffraction and chemically analyzed for nickel, iron and manganese content. The cubic spinel lattice constants, chemical composition and x-ray densities for the crystals resulting from each crucible are reported in Table 6.

TABLE 6

Lattice Constant Data and Chemical Composition Data Along With the Calculated X-Ray Density (D) of Ternary Cubic Spinel Monocrystals Obtained From Flux Growth Method

| Crucible | Lattice Constant $a_o(\text{Å})$ | Chemical Composition $Ni_xFe_yMn_zO_4 = M_3O_4$ | | | X-ray Density $D[g/cm^3]$ |
|---|---|---|---|---|---|
| | | x | y | z | |
| 1 | 8.3598 | 0.943 | 1.183 | 0.875 | 5.307 |
| 2 | 8.3928 | 0.837 | 0.787 | 1.377 | 5.227 |
| 3 | 8.4239 | 0.768 | 0.362 | 1.870 | 5.155 |
| 4 | 8.3941 | 0.828 | 0.585 | 1.587 | 5.220 |
| 5 | 8.3975 | 0.810 | 0.509 | 1.681 | 5.211 |
| 6 | 8.3873 | 0.860 | 0.842 | 1.298 | 5.241 |
| 7 | 8.3427 | 0.933 | 1.196 | 0.871 | 5.339 |

The resulting crystals ranged in size up to about 0.635 cm along an edge.

The compositions calculated in terms of the individual oxides are given in Table 7 and are plotted as atomic fractions of $M_3O_4$ in FIG. 3.

TABLE 7

Formula Weight (FW) Of The Ternary Cubic Spinel Crystals With The Oxide Values In Mole Percent (m/o)$_f$ Along with Their Starting Materials In Mole Percent (m/o)$_i$ With Respect To Solute

| Parameters | Crucible | | | | | | |
|---|---|---|---|---|---|---|---|
| | 1 | 2 | 3 | 4 | 5 | 6 | 7 |
| (NiO)$_i$ | 50.2 | 41.9 | 47.0 | 50.0 | 45.0 | 50.0 | 50.0 |
| (Fe$_2$O$_3$)$_i$ | 22.6 | 16.2 | 6.0 | 10.0 | 10.0 | 15.0 | 22.5 |
| (Mn$_2$O$_3$)$_i$ | 27.2 | 41.9 | 47.0 | 40.0 | 45.0 | 35.0 | 27.5 |
| (NiO)$_f$ | 47.8 | 43.6 | 40.8 | 43.3 | 42.3 | 44.5 | 47.5 |
| (Fe$_2$O$_3$)$_f$ | 30.0 | 20.5 | 9.6 | 15.3 | 13.3 | 21.8 | 30.4 |
| (Mn$_2$O$_3$)$_f$ | 22.2 | 35.9 | 49.6 | 41.5 | 43.9 | 33.6 | 22.1 |
| (FW) | (233.43) | (232.67) | (232.02) | (232.45) | (232.31) | (232.81) | (233.40) |

EXAMPLE II

Sensors developed from the materials grown in the crucibles were used to determine the change in resistance of the material at various temperatures. Sensors were produced as follows. Monocrystals were recovered from the flux and cleaned. Electrical contact(s) were made by applying a dab of Dupont 4922N silver paint mixed with butyl acetate onto a face of a specimen, and drying this contact at 100° C. for 10 minutes. The contacts were cured at 200° C. for 1 hour. One mil Pt wires were then soldered on to the fired ink spots.

EXAMPLE III

Electric characteristics (expressed in mks units) of a contacted monocrystal from crucible 3, prepared as explained in Example II, were analyzed with a Hewlett-Packard 4192A Impedance Analyzer at room temperature. Impedance-frequency spectra were obtained for sixty-five frequencies ranging from 5 to $1.3 \times 10^7$ Hz intervals. The impedance analysis in terms of frequency (f) in Hertz, series resistance (Rs) and series capacitive reactance ($X_s$) was obtained. The ($R_S, X_S$) data can be converted to their parallel ($R_p, X_p$) equivalents. Several impedance related properties can be calculated such as capacitance. See Impedance Spectroscopy, Edited by J. Ross Macdonald, John Wiley and Sons (1987) and especially chapters 1 and 4 thereof which are hereby incorporated by reference.

Figure 7:
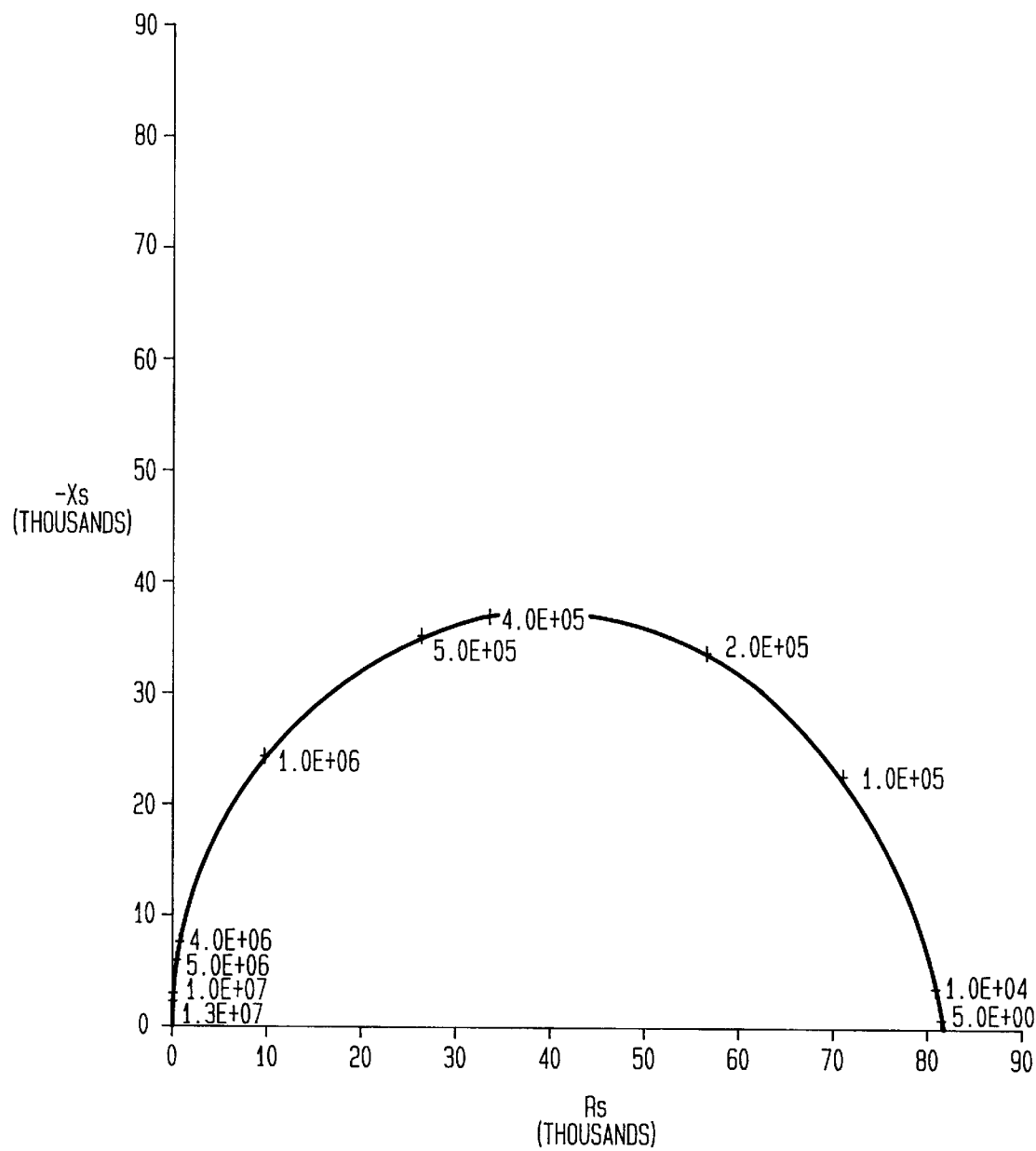
FIG. 7 is an impedance plane plot of a monocrystal from crucible 3 prepared as described in Example I.

An impedance plane plot of the ($R_S$, $X_S$,f) data generated by the HP4192A is shown for the ambient isotherm (24.5° C.) in FIG. 7. A crystal from crucible 3 was analyzed. This plot also confirms that the resulting crystal was a good quality monocrystal with no inclusions or defects.

Figure 8:
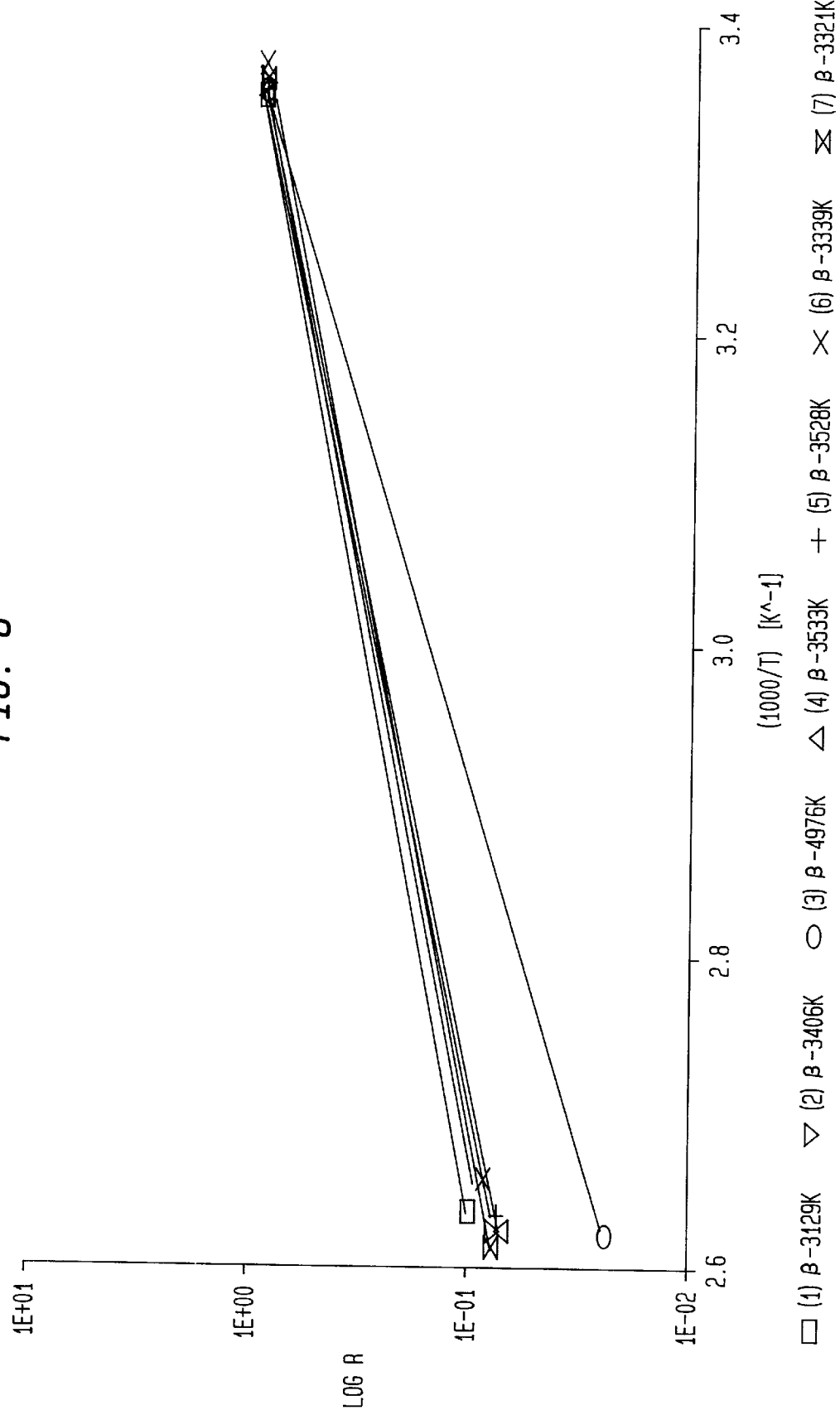
FIG. 8 presents semi-log plots of the resistance versus inverse temperature for the cubic spinel monocrystals obtained from crucibles 1 through 7.

FIG. 8 is a semi-log plot of resistance versus inverse temperature for the monocrystals from crucibles 1–7. This illustrates the thermistor properties of the resulting material, also known as their β-values. These properties are also described in Table 8. As is clearly evident, all of the seven crystals exhibited properties which make them useful as sensors generally and as thermistors in particular.

TABLE 8

Beta Values for Crucibles 1–7

| Crucible # | (Fe$_2$O$_3$)$_i$ m/o | (Mn$_2$O$_3$)$_i$ m/o | β[eV] | β[K] | Comments |
|---|---|---|---|---|---|
| 3 | 6.0 | 47.0 | 0.429 | 4976 | $\overline{BF}$ line in FIG. 1 |
| 5 | 10.0 | 45 | 0.304 | 3528 | " |
| 2 | 16.2 | 41.9 | 0.293 | 3406 | " |
| 4 | 10.0 | 40 | 0.304 | 3533 | $\overline{BA}$ line in FIG. 1 |

TABLE 8-continued

Beta Values for Crucibles 1–7

| Crucible # | (Fe$_2$O$_3$)$_i$ m/o | (Mn$_2$O$_3$)$_i$ m/o | β[eV] | β[K] | Comments |
|---|---|---|---|---|---|
| 6 | 15.0 | 35 | 0.288 | 3339 | " |
| 7 | 22.5 | 27.5 | 0.286 | 3321 | " |
| 1 | 22.6 | 27.2 | 0.270 | 3129 | " |

The change in resistivity (ρ) of a material with respect to temperature is the property utilized by designers in developing thermistors. The resistivity of a material along with the resistance (R), of a particular specimen, can be expressed as an exponential function of its temperature, and written in logarithmic form as $\log_{10}R=\{[E/2.303k_B]/T\}+A$ where A is assumed constant, $k_B$ is the Boltzmann constant, T is the absolute temperature and E is the activation energy for conductivity ($\sigma=1/\rho$), a characteristic related like its reciprocal ($\rho$) to the material's composition and crystal structure. According to this equation, a plot of $\log_{10}R$ against reciprocal temperature (1/T), over a given temperature interval, should be a straight line with a slope of $[E/(2.303k_B)]$ which permits calculation of the ratio of the activation energy (E) to the Boltzmann constant ($k_B$). The Beta value ($\beta$) equals $Ek_B$. This slope ($\beta$) describes the observed decrease of resistance with increasing temperature. The greater the Beta value, the greater the activation energy ($E=\beta k_B$), the greater the change in resistance with respect to temperature.

As shown in FIG. 8, the log of the resistance is plotted against the inverse temperature (in degrees Kelvin) for crucibles 1 to 7. The lowest temperatures plotted range between (23 to 25)° C. and the highest temperatures plotted range between (103 to 108)° C. To highlight the changes in the slopes of these lines, we normalized all ambient resistance values to one. The Beta [$\beta$] values obtained from these slopes are presented in Table 8 in decreasing value of [$\beta$], along with initial values of $[(NiO)_i]$, $[(Fe_2O_3)_i]$, $[(Mn_2O_3)_i]$ in (m/o) and lattice constant $a_0$ for the resulting cubic spinel monocrystals shown in tables 7 and 6 respectively. From FIG. 1, the data for crucibles (4,6,7,1) can be placed along the line of constant (NiO)m/o, connecting points (B,A). The data for crucibles (3,5,2) can be placed along the line connecting points (B,F). Given this arrangement we see from line AB a decrease in [$\beta$] with increasing initial Fe at constant Ni along with a decrease in the edge length of a unit cell ($a_0$). From line BF we see again a decrease in [$\beta$] with increasing [Fe] and decreasing [Ni] along with a decrease in the edge length of a unit cell ($a_0$). The $a_0$ also decreases with decreasing [Mn] as shown by the line connecting crucibles (3&4), (5&6), (2&7).

These monocrystals, with no grain boundaries, have greatly reduced dispersion effects, faster electric relaxation times and thermal response times. Clearly, the absence of charge carrier-grain boundary scattering results in electric field effects and transport processes that differ from the ceramic counterparts. The intergranular structure of the ceramic polycrystal makes these physical properties unpredictable, and more difficult to understand and control than those of monocrystals. It appears that a standard thermistor now can be prepared from a single crystal and used to evaluate the performance of ceramic devices.

The principles, preferred embodiments and modes of operation of the present invention have been described in the foregoing specification. The invention which is intended to be protected herein, however, is not to be construed as limited to the particular embodiments disclosed, since these are to be regarded as illustrative rather than restrictive. Variations and changes may be made by others without departing from the spirit and scope of the invention.

BIBLIOGRAPHY

The text of the references and in particular, the pages indicated below are hereby incorporated by reference.

(1) E. G. Larson, R. J. Arnott, D. G. Wickham, "Preparation, Semi-Conduction and Low Temperature Magnetization of the System $Ni_{1-x}Mn_{2+x}O_4$", *J. Physics and Chemistry Solids*, Vol. 23, (1962), 1771–1781.

(2) K. J. Standley, Oxide Magnetic Materials, Monographs On The Physics and Chemistry of Materials. 2nd. ed., Clarendon Press. Oxford (1972), pp. 140.

(3) D. G. Wickham, "Solid-Phase Equilibria In The System $NiO-Mn_2O_3-O_2$", *J. Inorg. Nucl. Chem.*, 26, (1964), 1369–1377.

(4) E. M. Levin and Clyde McDaniel, *J. Amer. Ceram. Soc.*, 45, [8] 356 (1962).

(5) D. G. Wickham, "The Chemical Compositions of Spinels in the System $Fe_3O_4-Mn_3O_4$" *J. Inorg. NucL. Chem.* 31 313(1969).

(6) A. E. Paladino, Jr., "Phase Equilibria in Ferrite Region of the System Fe—Ni—O", *J. Am. Ceram. Soc.*, 42 [4] 168–75(1959).

(7) 1993 Thermometrics Catalog—"Worldwide Capability in Thermistors."

We claim:

1. A monocrystal of nickel-iron-manganese oxide having a cubic spinel geometry.

2. The monocrystal of claim 1 having an atomic ratio R=Mn/(Ni+Fe+Mn) which ranges from between about 0.252 and about 0.800 based on Mn.

3. The monocrystals of claim 1 having a lattice parameter which ranges from between 8.338 and about 8.522 Angstroms.

4. The monocrystals of claim 1 having a lattice parameter which ranges from between 8.338 and about 8.519 Angstroms.

5. The monocrystals of claim 1 having a lattice parameter which ranges from between 8.338 and about 8.436 Angstroms.

6. The monocrystals of claim 1 having a lattice parameter which ranges from between 8.343 and about 8.424 Angstroms.

7. A monocrystal of nickel-manganese-iron-oxide having a cubic spinel geometry and composition in the region of solid solutions bounded by the lines connecting the four corners shown in FIG. 1 by the points ABB'DFA.

8. A monocrystal of nickel-manganese-iron-oxide having a cubic spinel geometry and composition in the region of solid solutions bounded by the lines connecting the four corners shown in FIG. 1 by the points ABB'DEA.

9. A monocrystal of nickel-manganese-iron-oxide having a cubic spinel geometry and composition in the region of solid solutions bounded by the lines connecting the four corners shown in FIG. 3 by the points GHKLNG.

10. A sensor capable of detecting at least one temperature within a range of between about −80° C. and about 500° C. comprising a sensing element consisting of monocrystalline nickel-iron-manganese oxide cubic spinel and a pair of terminals in contact with said sensing element, whereby electrical resistance between said terminals will vary with the temperature of said sensing element.

11. A sensor as claimed in claim 10 wherein said terminals are in substantially ohmic contact with said element.

12. A sensor as claimed in claim 10 wherein said terminals are formed from metals selected from the group consisting of noble metals and their alloys and copper and its alloys.

13. The sensor of claim 10 further comprising a pair of leads, one said lead being connected to each said terminal.

14. The sensor of claim 10 further comprising a housing supporting and enclosing at least a portion of said element.

15. The sensor of claim 10 further comprising means for measuring the electrical resistance between said terminals to thereby measure the temperature of said element.

16. A method of providing a resistance in an electrical circuit related to an unknown temperature comprising the steps of:

exposing a sensing element at least a portion of which consists of a nickel-manganese-iron-oxide cubic spinel monocrystal to the unknown temperature so that said monocrystal reaches a measuring temperature approximating said unknown temperature while said element is connected in said circuit.

17. The method of claim 16 further comprising the step of actuating said circuit to apply an alternating current through said element.

18. The method of claim 17 wherein said alternating current has a frequency above about 10 Hz.

19. The method of claim 16 further comprising the steps of actuating said circuit to apply direct current.

20. The method of claim 16 further comprising the step of measuring said resistance to thereby measure said unknown temperature.

21. The method of claim 16 wherein said circuit includes one or more additional circuit elements having electrical properties which vary with temperature, said additional circuit elements being exposed to said unknown temperature along with said sensing element, whereby the resistance of said sensing element and the electrical properties of said additional circuit elements will both vary with variations in said unknown temperature, said circuit being connected so that variations in said resistance of said circuit element counteract variations in said electrical properties of said additional circuit elements.

* * * * *

UNITED STATES PATENT AND TRADEMARK OFFICE
CERTIFICATE OF CORRECTION

PATENT NO. : 5,936,513
DATED : August 10, 1999
INVENTOR(S) : Rosen et al.

It is certified that error appears in the above-identified patent and that said Letters Patent is hereby corrected as shown below:

Column 5, line 3, after "iron" insert --,--.

Column 5, line 36, ""Tt"" should read --"$T_t$"--.

Column 8, line 67, "Thermometrics°" should read --Thermometrics'--.

Column 9, in the *Note in TABLE 4, "$B_2O_3/Bi_2O_3$)" should read --($B_2O_3/Bi_2O_3$)--.

Column 12, line 6, "(Rs)" should read --($R_S$)--.

Column 12, line 7, "($R_8,X_8$)" should read --($R_S,X_S$)--.

Column 12, line 13, "( $R_8$, $X_8$, f)" should read --($R_S,X_S,$f)--.

Signed and Sealed this

Fourteenth Day of March, 2000

Attest:

Q. TODD DICKINSON

*Attesting Officer*      *Commissioner of Patents and Trademarks*